(12) United States Patent
Wu et al.

(10) Patent No.: US 11,158,618 B2
(45) Date of Patent: Oct. 26, 2021

(54) LIGHT CONVERSION DEVICE

(71) Applicants: National Tsing Hua University, Hsinchu (TW); EPISTAR CORPORATION, Hsinchu (TW)

(72) Inventors: Meng-Chyi Wu, Hsinchu (TW); Jyun-Hao Liao, Hsinchu (TW); Hsiang-Hui Wang, Hsinchu (TW)

(73) Assignees: NATIONAL TSING HUA UNIVERSITY, Hsinchu (TW); EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/657,574

(22) Filed: Oct. 18, 2019

(65) Prior Publication Data
US 2020/0343232 A1  Oct. 29, 2020

(30) Foreign Application Priority Data
Apr. 26, 2019  (TW) .................................. 108114637

(51) Int. Cl.
*H01L 25/16* (2006.01)
*H01L 23/00* (2006.01)

(52) U.S. Cl.
CPC ............ *H01L 25/167* (2013.01); *H01L 24/32* (2013.01); *H01L 2224/32145* (2013.01);
(Continued)

(58) Field of Classification Search
CPC ......... H01L 25/167; H01L 2224/32137; H01L 27/14649; H01L 2924/12043;
(Continued)

(56) References Cited

U.S. PATENT DOCUMENTS

| | | | | |
|---|---|---|---|---|
| 5,204,521 A | * | 4/1993 | Lin ...................... | G06N 3/0675 250/214 LS |
| 2004/0104396 A1 | * | 6/2004 | Nakatsu .................. | H01L 33/14 257/85 |

(Continued)

FOREIGN PATENT DOCUMENTS

| | | |
|---|---|---|
| CN | 105322097 A | 2/2016 |
| CN | 107516684 A | 12/2017 |

(Continued)

OTHER PUBLICATIONS

Sze et al., Physics of Semiconductor Devices, John Wiley & Sons, Inc., 2007, pp. 683-697 (Year: 2007).*

*Primary Examiner* — Shih Tsun A Chou
(74) *Attorney, Agent, or Firm* — Birch, Stewart, Kolasch & Birch, LLP

(57) ABSTRACT

A light conversion device includes a light-emitting unit, a photoelectric conversion unit, and an electroconductive bonding layer. Each of the light-emitting unit and the photoelectric conversion unit includes a first-type region and a second-type region opposite to the first-type region. The electroconductive bonding layer is disposed between the light-emitting unit and the photoelectric conversion unit for connecting the photoelectric conversion unit with the light-emitting unit. When the photoelectric conversion device is operated to receive a bias and an external light, the light-emitting unit generates a modulated light different from the external light in frequency.

10 Claims, 4 Drawing Sheets

(52) U.S. Cl.
CPC ............ *H01L 2924/12041* (2013.01); *H01L 2924/12042* (2013.01); *H01L 2924/12043* (2013.01)

(58) Field of Classification Search
CPC . H01L 2924/12041; H01L 2224/32145; H01L 24/32
See application file for complete search history.

(56) References Cited

U.S. PATENT DOCUMENTS

| | | | |
|---|---|---|---|
| 2005/0083567 A1* | 4/2005 | Chun Liu | H01L 31/173 359/326 |
| 2010/0321755 A1* | 12/2010 | Cho | G01S 7/4914 359/248 |
| 2016/0233370 A1* | 8/2016 | Jiang | H01L 31/173 |
| 2017/0094199 A1* | 3/2017 | Sarusi | G01J 5/10 |

FOREIGN PATENT DOCUMENTS

| | | | |
|---|---|---|---|
| CN | 108011017 A | 5/2018 | |
| TW | 480749 B | 3/2002 | |
| TW | 200816527 A | 4/2008 | |

\* cited by examiner

LIGHT CONVERSION DEVICE

CROSS-REFERENCE TO RELATED APPLICATION

This application claims priority of Taiwanese Invention Patent Application No. 108114637, filed on Apr. 26, 2019.

FIELD

The disclosure relates to a light conversion device, more particularly to a light conversion device with an electroconductive bonding layer connecting a light-emitting unit with a photoelectric conversion unit.

BACKGROUND

A light-emitting diode (LED) and a photodiode (PD) in a conventional light conversion device are generally connected to each other using a direct epitaxial growth method or a wafer fusion method. For the former method, the LED and the PD are epitaxially grown together in the epitaxial growth stage. In other words, one of the LED and the PD is first formed epitaxially, and then the other of the LED and the PD is grown epitaxially on the first. For the latter method, an LED epitaxial wafer and a PD epitaxial wafer are fusion bonded together, and then the manufacturing of the light conversion device is continued.

When the direct epitaxial growth method is used, the selection of the materials used needs to be carefully considered. Since active region of the PD, which receives infrared light, and the active region of the LED, which emits visible light, are made from two materials with very different band gaps, it is difficult to select appropriate compositions for these two materials to perform the epitaxial growth thereof. Stress and lattice matching of multi-layered structures of the PD and the LED would also need to be considered in order to achieve good epitaxial quality and to form sensitive and reliable light conversion devices. Because of the numerous requirements of the materials used, it can be difficult to select an optimized combination of the materials used for the light conversion devices such that the choices of materials useful for making the LED and the PD are relatively limited when the direct epitaxial growth method is used.

The wafer fusion method needs to be performed under suitable temperature and pressure and in the presence of suitable gas so as to successfully join the LED epitaxial wafer and the PD epitaxial wafer. When unsuitable temperature and/or pressure are selected, the wafers may crack, or defects may be formed at the interface between the wafers. Since the conventional light conversion device formed by using this method has a lower yield and a lower conversion efficiency, this method remains mostly in laboratory stage, and mass production can hardly be achieved. Moreover, the conventional light conversion device produced by using either the direct epitaxial growth method or the wafer fusion method is currently restricted to act as an up-converter.

SUMMARY

Therefore, the object of the disclosure is to provide a light conversion device which can alleviate at least one of the drawbacks of the prior art.

According to the disclosure, a light conversion device includes a light-emitting unit, a photoelectric conversion unit, and an electroconductive bonding layer.

The light-emitting unit includes a first-type region and a second-type semiconductor region opposite to the first-type region.

The photoelectric conversion unit includes a first-type region and a second-type region opposite to the first-type region. The photoelectric conversion unit is capable of converting an optical signal to an electrical signal when a reverse bias is applied thereto.

The electroconductive bonding layer is disposed between the light-emitting unit and the photoelectric conversion unit for connecting the first-type region of the light-emitting unit with the first-type region of the photoelectric conversion unit or connecting the second-type region of the light-emitting unit with the second-type region of the photoelectric conversion unit. When the photoelectric conversion device is operated to receive a bias and an external light to make the light-emitting unit be under a forward bias and the photoelectric conversion unit be under a reverse bias, the external light irradiates the photoelectric conversion unit such that the light-emitting unit generates a modulated light which has a frequency different from that of the external light.

The effect of the invention lies in that, in this disclosure, the light emitting unit and the photoelectric conversion unit are first produced individually, then regions of the light emitting unit and the photoelectric conversion unit having the same conductivity type are interconnected through the conductive bonding layer by the flip-chip bonding technique so as to produce the light conversion device. The light conversion device of the disclosure does not involve a complicated heterogeneous epitaxial structure, and high temperature and high pressure conditions used in wafer fusion bonding method are not required in this disclosure.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
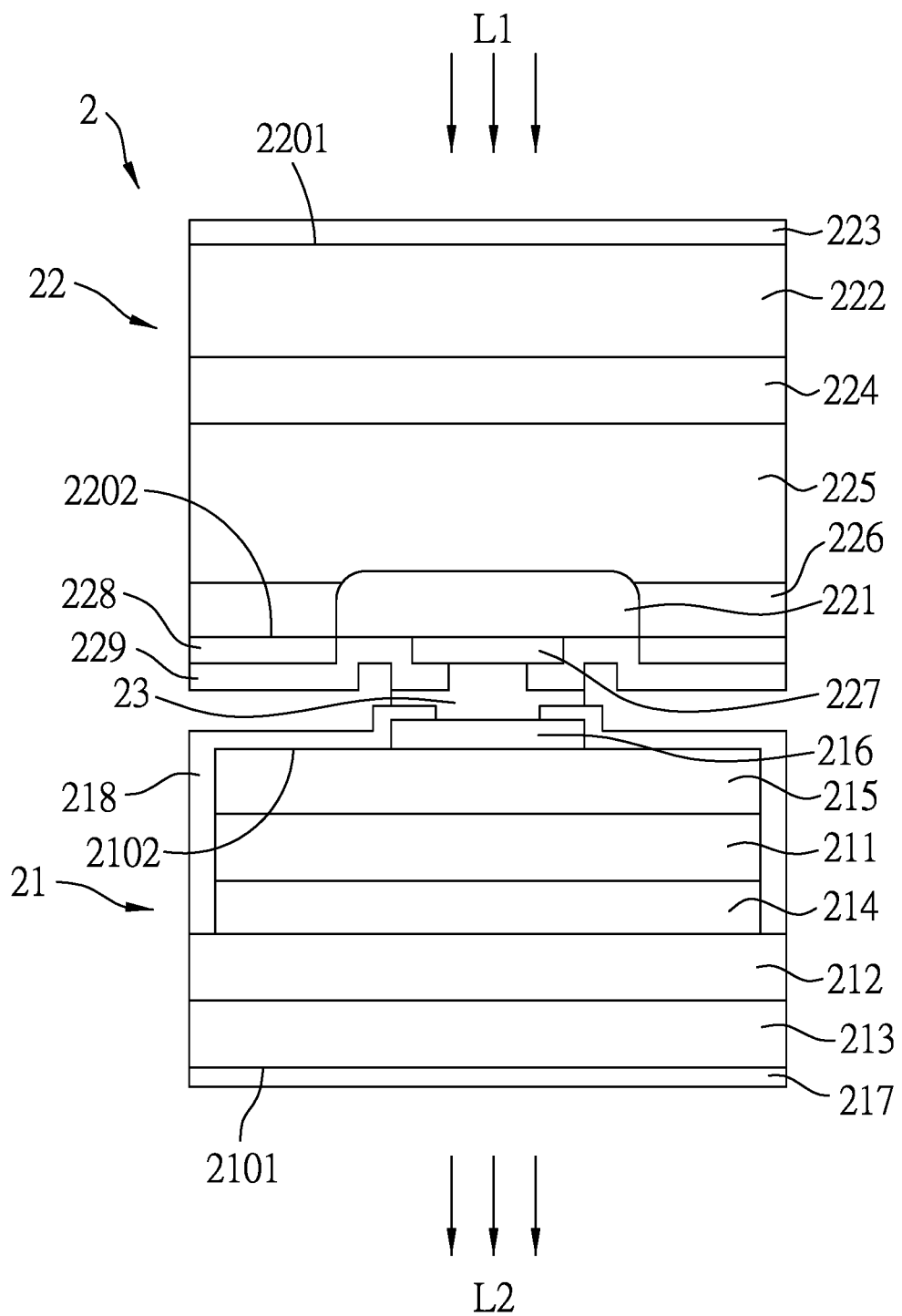
FIG. 1 is a schematic view of a first embodiment of a light conversion device according to the disclosure.

Before the present invention is described in greater detail, it should be noted that where considered appropriate, reference numerals or terminal portions of reference numerals have been repeated among the figures to indicate corresponding or analogous elements, which may optionally have similar characteristics.

Figure 2:
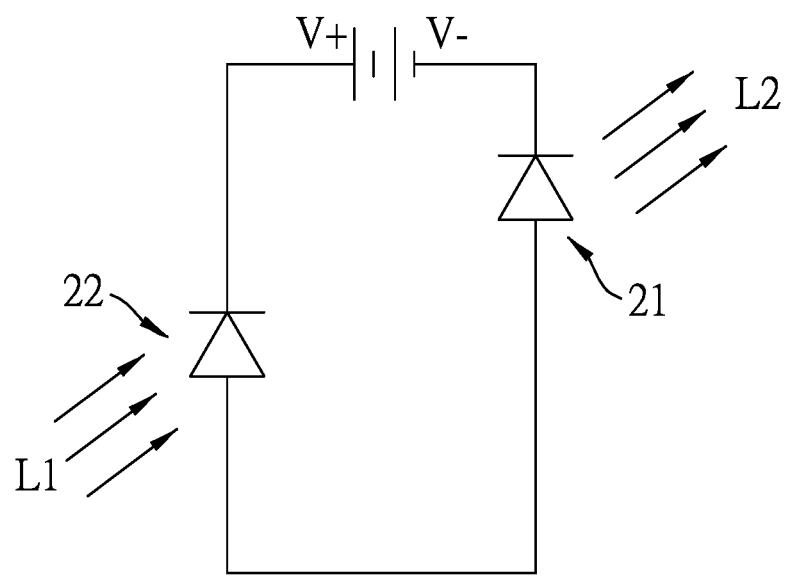
FIG. 2 is a schematic view of a circuit diagram of the first embodiment.

Referring to FIGS. 1 and 2, a first embodiment of a light conversion device 2 includes a light-emitting unit 21, a photoelectric conversion unit 22, and an electroconductive bonding layer 23 connecting the light-emitting unit 21 and the photoelectric conversion unit 22.

The light-emitting unit 21 includes a first-type region 211, a second-type region 212 opposite to the first-type region 211, and a light-emitting region 214 disposed between the first-type region 211 and the second-type region 212, and is capable of emitting light when a forward bias is applied thereto.

The photoelectric conversion unit 22 includes a first-type region 221 and a second-type region 222 opposite to the first-type region 221, and is capable of converting an optical signal to an electrical signal when a reverse bias is applied thereto.

Each of the first-type regions 211 of the light-emitting unit 21 and the first-type region 221 of the photoelectric conversion unit 22 includes one of a p-type semiconductor layer and an n-type semiconductor layer, and each of the second-type region 212 of the light-emitting unit 21 and the second-type region 222 of the photoelectric conversion unit 22 includes the other one of the p-type semiconductor layer and the n-type semiconductor layer.

The light-emitting unit 21 may include a light-emitting diode (LED) made of group III-V compound semiconductors, a laser diode made of group III-V compound semiconductors, or an organic LED. The laser diode may be a vertical-cavity surface-emitting laser (VCSEL). The photoelectric conversion unit 22 may include a photodiode made of silicon or group III-V compound semiconductors, or a phototransistor.

The light-emitting unit 21 is capable of emitting light having an optional wavelength, such as ultraviolet light, purple light, blue light, green light, yellow light, orange light, red light, or near infrared light. When the photoelectric conversion unit 22 includes a photodiode, the photodiode may be an avalanche photodiode (APD) primarily made of group IV materials or a positive-intrinsic-negative photodiode (PIN PD), for example a silicon-based APD or a silicon-based PIN PD. The photodiode may also be an APD made of group III-V compound semiconductors, such as an indium gallium arsenic (InGaAs) APD, or a PIN PD made of group III-V compound semiconductors, such as an InGaAs PIN PD or an indium antimony (InSb) PIN PD.

The electroconductive bonding layer 23 is disposed between the light-emitting unit 21 and the photoelectric conversion unit 22 for electrically connecting the first-type region 211 of the light-emitting unit 21 and the first-type region 221 of the photoelectric conversion unit 22, wherein there is a lattice mismatch between the first-type region 211 of the light-emitting unit 21 and the first-type region 221 of the photoelectric conversion unit 22, or a lattice constant of the first-type regions 211 of the light-emitting unit 21 is substantially different from that of the first-type region 221 of the photoelectric conversion unit 22. For example, when the first-type regions 211, 221 are both p-type and the second-type regions 212, 222 are both n-type, the electroconductive bonding layer 23 connects the p-type region of the light-emitting unit 21 with the p-type region of the photoelectric conversion unit 22 in anti-series. In variations of the embodiment where the first-type regions 211, 221 are both n-type and the second-type regions 212, 222 are both p-type, the electroconductive boding layer 23 connects the n-type region of the light-emitting unit 21 with the n-type region of the photoelectric conversion unit 22 in anti-series.

In this embodiment, the electroconductive bonding layer 23 may include a metal or a metal alloy. For example, the electroconductive bonding layer 23 may include a metal or a metal alloy with low melting point such as indium (In), gold (Au), tin (Sn), gold indium (AuIn) alloy, gold tin (AuSn) alloy, indium tin (InSn) alloy, gold indium tin (AuInSn) alloy, tin lead (SnPb) alloy, gold germanium (AuGe) alloy, or gold silicon (AuSi) alloy.

In this embodiment, the photoelectric conversion unit 22 is an InGaAs PIN PD, the laminar structure of which sequentially includes, along a direction of the external light L1 incident toward the electroconductive bonding layer 23, a first metal electrode 223 acting as an external electrode of the light conversion device 2 for electrically connecting to a power terminal of an external power source (not shown), the second-type region 222 composed of an n-doped indium phosphide (InP) substrate (the first-type is p-type and the second type is n-type in the present embodiment), a first undoped InP layer 224, an undoped InGaAs layer 225, a second undoped InP layer 226, and the first-type region 221 composed of a p-doped InP layer, a second metal electrode 227 disposed on the first-type region 221 and acting as an internal electrode for electrically connecting to the light-emitting unit 21 through the electroconductive bonding layer 23, a hard mask 228 disposed on the second undoped InP layer 226 and made of silicon dioxide ($SiO_2$) or silicon nitride ($Si_3N_4$), and a protective layer 229 covering the hard mask 228, exposing a portion of the second electrode 227, and made of silicon dioxide ($SiO_2$) or silicon nitride ($Si_3N_4$). Thus, in this embodiment, the photoelectric conversion unit 22 is planar-type.

The light-emitting unit 21 has a substantially laminar structure, and sequentially includes a third metal electrode 217 acting as another external electrode of the light conversion device 2 for electrically connecting to another power terminal of the external power source (not shown), an electroconductive substrate 213 disposed on the third metal electrode 217, the second-type region 212 disposed on the electroconductive substrate 213 and including an n-type cladding layer composed of group III-V compound (e.g. GaN), the light-emitting region 214 including a multiple quantum well (MQW) structure and disposed on the second-type region 212, the first-type region 211 disposed on the light-emitting region 214 and including a p-type cladding layer composed of group III-V compound (e.g. GaN), an electrical contact layer 215 disposed on the first-type region 211, a fourth metal electrode 216 disposed on the electrical contact layer 215 and acting as another internal electrode for electrically connecting to the photoelectric conversion unit 22 through the electroconductive bonding layer 23, and a protective layer 218 covering the fourth metal electrode 216, the electrical contact layer 215, the first-type region 211, the light-emitting region 214 and the second-type region 212 and exposing a portion of the fourth metal electrode 216. Thus, in this embodiment, the light-emitting unit 21 is mesa-type.

The photoelectric conversion unit 22 of this embodiment is exemplified as a PIN PD, but in other embodiments, the photoelectric conversion unit 22 may be an APD to amplify the photoelectric current and enhance the photoelectric effect. Details of the structure of the APD are not essential features of the disclosure and are well known to those skilled in the art, and thus are omitted for the sake of brevity.

When the light conversion device 2 is in operation, a bias Vb is applied between the first metal electrode 223 and the third metal electrode 216 and the external light L1 is incident on the light conversion device 2 to generate the modulated light L2. Specifically, the external light L1 irradiates the photoelectric conversion unit 22 and the bias Vb is applied to the photoelectric conversion device 2 to make the light-emitting unit 21 be under a forward bias and the photoelectric conversion unit 22 be under a reverse bias such that the light-emitting unit 21 generates a modulated light L2. The modulated light L2 has a frequency different from that of the external light L1.

Specifically, as shown in FIGS. 1 and 2 and as mentioned in the above, in this embodiment, the first-type regions 211, 221 are p-type and the second-type regions 212, 222 are n-type. The negative side (V−) of the bias Vb is applied to the second-type region 212 of the light-emitting unit 21 and the positive side (V+) of the bias Vb is applied to the second-type region 222 of the photoelectric conversion unit 22. Consequently, the light-emitting unit 21 is under the forward bias and capable of emitting the modulated light L2, and the photoelectric conversion unit 22 is under the reverse bias and capable of absorbing the external light L1. Particularly, when the external light L1 is incident on the photoelectric conversion unit 22, the photoelectric current is generated inside the photoelectric conversion unit 22. Since the light-emitting unit 21 and the photoelectric conversion unit 22 are electrically connected in anti-series, the photoelectric current flows from the second-type (n-type) region 212 of the light-emitting unit 21 to the first-type (p-type) region 211 of the light-emitting unit 21 to thereby make the light-emitting unit 21 emit the modulated light L2. In other variations of this embodiment where the first-type regions 211, 221 are n-type and the second-type regions 212, 222 are p-type, the positive side (V+) of the bias Vb is applied to the second-type region 212 of the light-emitting unit 21 and the negative side (V−) of the bias Vb is applied to the second-type region 222 of the photoelectric conversion unit 22 such that the light-emitting unit 21 is under a forward bias, and the photoelectric conversion unit 22 is under a reverse bias and irradiated by the external light L1, to thereby convert the external light L1 into the modulated light L2.

It is noted herein that the first metal electrode 223 and the second metal electrode 227 are respectively disposed at two opposite outer surfaces, i.e. first outer surface 2201 and second outer surface 2202 of the photoelectric conversion unit 22. The third metal electrode 217 and the fourth metal electrode 216 are respectively disposed at two opposite outer surfaces, i.e. first outer surface 2101 and second outer surface 2102 of the light-emitting unit 21. In this embodiment, the light-emitting unit 21 and the photoelectric conversion unit 22 are substantially equal in surface area and connected through the electroconductive bonding layer 23 to form the light conversion device 2 having a vertical-type structure. In this vertical-type structure, the external light L1 can be directly incident on the photoelectric conversion unit and the modulated light L2 emitted by the light-emitting unit 21 is capable of travelling in a direction opposite to the incident direction of the external light L1 such that the external light L1 and the modulated light L2 do not interfere with each other. The description of the light-emitting unit 21 and the photoelectric conversion unit 22 being substantially equal in surface area means that an projected area of the first-type region 221 of the photoelectric conversion unit 22 onto the light-emitting unit 21 is substantially equal to an surface area of the first-type region 211 of the light-emitting unit 21. In a variation of this embodiment, the description means that an area of a projection of the second-type region 222 of the photoelectric conversion unit 22 onto the light-emitting unit 21 is substantially equal to a surface area of the second-type region 212 of the light-emitting unit 21.

When the external light L1 is infrared light and the light-emitting unit 2 is an LED that emits visible light, the photoelectric current, generated by the photoelectric conversion unit 22 when it receives the reverse bias and the infrared light, flows into the light-emitting unit 21 which emits the visible light (i.e the modulated light L2) due to simultaneously receiving the forward bias and the photoelectric current from the photoelectric conversion unit 22. Since the infrared light has a lower frequency than the visible light, the light conversion device 2 is capable of converting the infrared light having a lower frequency to the visible light having a higher frequency and is called an up-converter. In another example where the frequency of the modulated light L2 is lower than that of the external light L1, the light conversion device 2 is called a down-converter.

In practical use, the light conversion device 2 may be applied singly, or a plurality of the light conversion devices 2 are arranged in a one-dimensional or a two-dimensional array to form an array-type light conversion device. When the external light L1 includes an image signal, each of the light conversion devices 2 included in the array-type light conversion device may be independently controllable, and the light emitting unit 21 and the photoelectric conversion unit 22 may be made to be micrometer scale, and to have the same (i) unit size and array size, (ii) period and shape in array arrangement, and (iii) quantity of units forming the array. Thus, the array-type light conversion device may be applied to, e.g. displays.

The light conversion device 2 of this disclosure is produced differently from the conventional light conversion device, leading to a different structure. A manufacturing method for the light conversion device 2 in the present embodiment comprises first producing the light-emitting unit 21 and the photoelectric conversion unit 22 individually, then forming parts of the electroconductive bonding layer 23 respectively on the first-type regions 211, 221 (or the second-type regions 212, 222), followed by bonding the part of the electroconductive bonding layer 23 on the light-emitting unit 21 with the part of the electroconductive bonding layer 23 on the photoelectric conversion unit 22 together by a metal bonding technique to form the light conversion device 2. In this embodiment, the electroconductive bonding layer 23 may include indium. Specifically, the fourth metal electrode 216 and the second metal electrode 227 respectively disposed on the first-type region 211 of the light-emitting unit 21 and the first-type region 221 of the photoelectric conversion unit 22 are each deposited with an indium metal layer, then the two indium metal layers are bonded together, wherein the first-type is p-type or n-type, and the second-type is opposite to the first-type.

Thus, unlike the conventional light conversion device which is produced either using direct epitaxial growth technique or fusion bonding technique, in the production of the light conversion device 2 of the disclosure, there is no need to select specific materials for hetero-epitaxy to avoid lattice mismatch as with the direct epitaxial growth technique for directly epitaxially growing the light-emitting unit 21 and the photoelectric conversion unit 22 successively nor does the production process need to take place under high temperature and high pressure conditions as with the fusion bonding technique. Only simple flip-chip bonding technique is needed to join the manufactured light-emitting unit 21 and photoelectric conversion unit 22 by bonding the two parts of the photoconductive bonding layer 23 respectively formed thereon.

Figure 3:
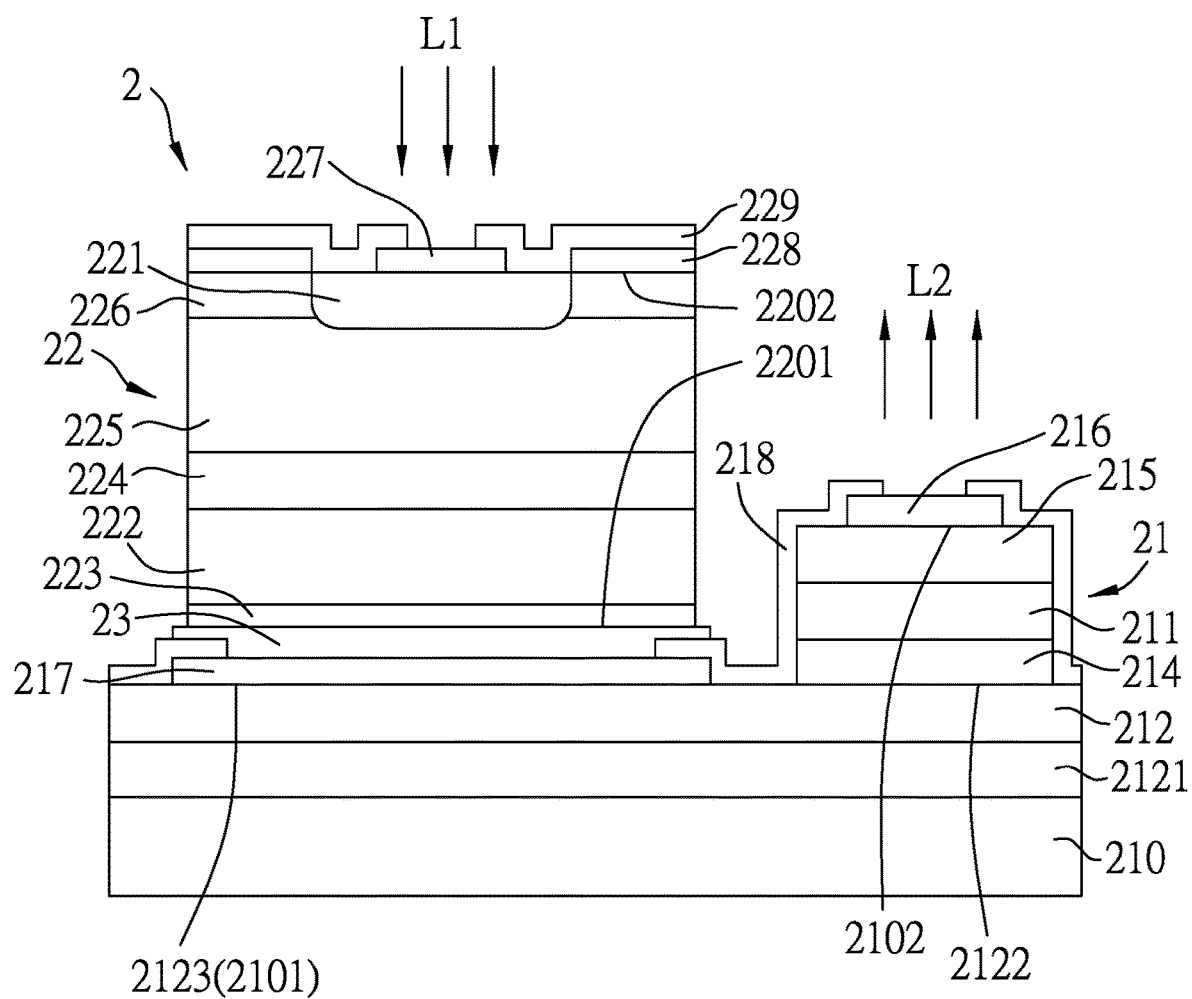
FIG. 3 is a schematic view of a second embodiment of a light conversion device according to the disclosure.
Figure 4:
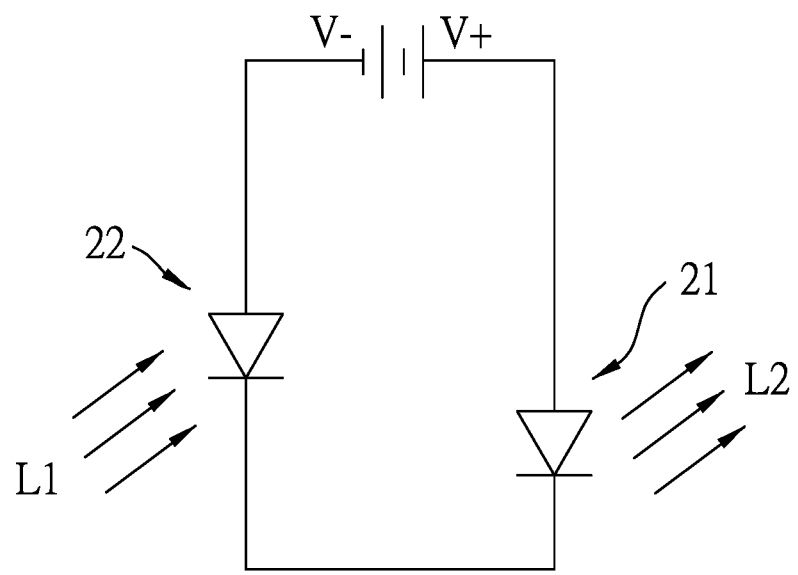
FIG. 4 is a schematic view of a circuit diagram of the second embodiment.

Referring to FIGS. 3 and 4, a second embodiment of a light conversion device 2 is similar to the first embodiment but differs in that the surface area of the light-emitting unit 21 is different from that of the photoelectric conversion unit 22, and that the third metal electrode 217 and the fourth metal electrode 216 of the light-emitting unit 21 are both disposed on the same side of a substrate 210 of the light-emitting unit 21 (as opposed to the first embodiment where the third metal electrode 217 and fourth metal electrode 216 are disposed on opposite sides of the substrate 213 of the light-emitting unit 21).

Specifically, in the second embodiment, the light-emitting unit 21 is manufactured to have a larger size, and the third metal electrodes 217 and the fourth metal electrode 216 are disposed on a same side of the light-emitting unit 21. The photoelectric conversion unit 22 is manufactured to have a smaller size, and the first metal electrodes 223 and the second metal electrode 227 thereof are disposed on two opposite sides of the photoelectric conversion unit 22. The third metal electrode 217 disposed on the second-type region 212 of the light-emitting unit 21 and the first metal electrode 223 disposed on the second-type region 222 of the photoelectric conversion unit 22 are respectively deposited with indium metal layers (i.e. the electroconductive bonding layer 23), then the indium metal layers are bonded together. The first-type can be p-type or n-type and the second-type is opposite to the first type. In this embodiment, the foregoing description of the light-emitting unit 21 being made to be a larger size and the photoelectric conversion unit 22 being made to be a smaller size means that the projected area of the second-type region 222 of the photoelectric conversion unit 22 onto the light-emitting unit 21 is smaller than the surface area of the second-type region 212 of the light-emitting unit 21.

Specifically, in the second embodiment, the laminar structure of the photoelectric conversion unit 22 includes sequentially, along a direction from the electroconductive bonding layer 23 toward the external light L1, the first metal electrode 223 acting as an internal electrode of the light conversion unit 2 for electrically connecting to the light-emitting unit 21 through the electroconductive bonding layer 23, the second-type region 222 disposed on the first metal electrode 223 and composed of an n-doped InP substrate (the second-type being n-type, and the first-type being p-type in the present embodiment), the undoped first InP layer 224 disposed on the second-type region 222, the undoped InGaAs layer 225 disposed on the first InP layer 224, the second undoped InP layer 226 disposed on the InGaAs layer 225, the first-type region 221 composed of a p-doped InP layer, the second metal electrode 227 disposed on the first-type region 221 and acting as an external electrode of the light conversion unit 2 for electrically connecting to an external power supply (not shown), the hard mask 228 disposed on the second InP layer 226 and made of silicon dioxide ($SiO_2$) or silicon nitride ($Si_3N_4$), and the protective layer 229 covering the hard mask 228, exposing a portion of the second metal electrode 227 and possibly being composed of silicon dioxide or silicon nitride. Thus, in this embodiment, the photoelectric conversion unit is planar-type. The laminar structure of the light-emitting unit 21 includes the substrate 210 (e.g. a sapphire substrate), a nucleation layer 2121 optionally disposed on the substrate 210, a n-type cladding layer (i.e. the second-type region 212) disposed on the nucleation layer 2121, being composed of a n-type group III-V compound (e.g. n-type GaN), and including a first section 2122 and a second section 2123 different from said first section 2122, the light-emitting region 214 disposed on the first section 2122 of the second-type region 212 and including a multiple-quantum-well (MQW) structure, the third metal electrode 217 disposed on the second section 2123 of the second-type region 212 and acting as another internal electrode of the light conversion unit 2 to electrically connect to the photoelectric conversion unit 22 through the electroconductive bonding layer 23, the first type region 211 disposed on the light-emitting region 214 and being a p-type cladding layer that is composed of a p-type group III-V compound (e.g. p-type GaN), the electrical contact layer 215 disposed on the first-type region 211, the fourth metal electrode 216 disposed on the electrical contact layer 215 and acting as another external electrode of the light conversion unit 2 for electrically connecting to the external power supply, and the protective layer 218 covering the light-emitting region 214, the electrical contact layer 215 and the first-type region 211, and exposing a portion of the fourth metal electrode 216. Thus, in this embodiment, the light-emitting unit 21 is mesa-type.

From the aforesaid structure, it is clear that the first-type region 211 of the light-emitting unit 21 is disposed on the first section 2122 of the light-emitting unit 21, and the second-type region 222 of the photoelectric conversion unit 22 is disposed on the second section 2123 of the light-emitting unit 21.

It should be noted that, in both the first embodiment and the second embodiment, the photoelectric conversion unit 22 may be mesa-type or planar-type, and the light-emitting unit 21 may be mesa-type or planar-type.

Evaluation of light conversion performance of the light conversion device of the disclosure is performed as follows.

First, the light conversion devices of Examples 1 to 4 according to the disclosure are prepared. Parameters used in a light conversion performance test and element types of the light conversion devices of Examples 1 to 4 and results thereof are summarized in Table 1 below.

Specifically, as shown in Table 1, the light conversion devices 2 of Examples 1 to 4 each had a Si PIN PD as the photoelectric conversion unit 22. The light-emitting units 21 of the light conversion devices of Examples 1 to 4 are LEDs made of group III-V compound semiconductors and respectively capable of emitting the modulated lights L2 of red, green, blue and ultraviolet lights (respectively referred to as red LED, green LED, blue LED and UV LED in Table 1). The external lights L1 incident on the light conversion devices 2 of Example 1 to 4 are laser lights respectively having wavelengths of 808 nm, 660 nm, 532 nm and 450 nm. The term "wavelength" as used in this disclosure refers to the peak wavelength unless specified otherwise. Using Example 1 as an example for illustration, where the photoelectric conversion unit 22 is a Si PIN PD, the light-emitting unit 21 is the red LED capable of emitting the modulated light L2 of 625 nm red light, a bias Vb of 2.1V is applied to the first metal electrode 223 and the second metal electrode 217 of the light conversion device 2, and the external light L1 is an infrared laser light of wavelength 808 nm, the light conversion device 2 of Example 1 achieves a conversion efficiency of 0.081W/W. The results of the other examples are appreciable in the same manner.

TABLE 1

|  | Example 1 | Example 2 |
| --- | --- | --- |
| Photoelectric conversion unit | Si PIN PD | Si PIN PD |
| Light-emitting unit | Red LED | Green LED |
| Bias (Vb) | 2.1 V | 2.2 V |

TABLE 1-continued

| External light (L1): type/ wavelength | Laser/ 808 nm | Laser/ 660 nm | Laser/ 532 nm | Laser/ 450 nm | Laser/ 808 nm | Laser/ 660 nm | Laser/ 532 nm | Laser/ 450 nm |
|---|---|---|---|---|---|---|---|---|
| Modulated light (L2): wavelength | | | 625 nm | | | | 520 nm | |
| Conversion efficiency | 0.081 W/W | 0.044 W/W | 0.037 W/W | 0.014 W/W | 0.037 W/W | 0.017 W/W | 0.014 W/W | 0.004 W/W |

|  | Example 3 | | | | Example 4 | | | |
|---|---|---|---|---|---|---|---|---|
| Photoelectric conversion unit | Si PIN PD | | | | Si PIN PD | | | |
| Light-emitting unit | Blue LED | | | | UV LED | | | |
| Bias (Vb) | 2.35 V | | | | 3.3 V | | | |
| External light (L1): type/ wavelength | Laser/ 808 nm | Laser/ 660 nm | Laser/ 532 nm | Laser/ 450 nm | Laser/ 808 nm | Laser/ 660 nm | Laser/ 532 nm | Laser/ 450 nm |
| Modulated light (L2): wavelength | | | 450 nm | | | | 370 nm | |
| Conversion efficiency | 0.158 W/W | 0.011 W/W | 0.085 W/W | 0.021 W/W | 0.076 W/W | 0.053 W/W | 0.033 W/W | 0.011 W/W |

Continuing on Example 1, the light conversion device 2 receives the external light L1 of 808 nm infrared laser light and emitted the modulated light L2 of 625 nm red light. That is to say, the light conversion device 2 absorbs light having a longer wavelength and emits light having a shorter wavelength under a bias. In this situation, the light conversion device 2 of Example 1 is acting as an up-converter. In other experiments of Example 1, for example, when the external light L2 of 450 nm blue laser light is absorbed and the modulated light (L2) of 625 nm red light is emitted, that is to say, the light conversion device 2 absorbs light having a shorter wavelength and emits light having a longer wavelength under a bias, the light conversion device 2 is acting as a down-converter. From Table 1, it can be found that when the light-emitting unit 21 is made of group III-V compound semiconductor, the photoelectric conversion unit 22 includes PIN PD made of group IV compound semiconductor, and the external light L1 is infrared light (for example, the wavelength thereof is 808 nm), the light conversion device 2 is acting as a up-converter and has a conversion efficiency of between 0.037W/W and 0.158W/W. As shown in Table 1, the photoelectric conversion unit 22 of the light conversion device 2 of each of Examples 1 to 4 is the Si PIN PD, but if a Si APD is used instead, a larger photoelectric current may be generated, and the light conversion device 2 may achieve a higher conversion efficiency and brightness.

Furthermore, the light conversion devices 2 of Examples 5 to 12 according to the disclosure are prepared, and the preparing parameters and the testing results are summarized in Table 2 below.

TABLE 2

|  | Example 5 | Example 6 | Example 7 | Example 8 | Example 9 | Example 10 | Example 11 | Example 12 |
|---|---|---|---|---|---|---|---|---|
| Photoelectric conversion unit | InGaAs PIN PD | InGaAs APD | InGaAs PIN PD | InGaAs APD | InGaAs PIN PD | InGaAs APD | InGaAs PIN PD | InGaAs APD |
| Light-emitting unit | Red LED | | Green LED | | Blue LED | | UV LED | |
| Bias (Vb) | 1.7 V | 62.8 V | 2.3 V | 55.44 V | 2.4 V | 56.4 V | 3.2 V | 56.4 V |
| External light (L1): type/ wavelength | | | | Laser/1312 nm | | | | |
| Modulated light (L2): wavelength | 625 nm | | 520 nm | | 450 nm | | 370 nm | |
| Conversion efficiency | 0.026 W/W | 0.132 W/W | 0.036 W/W | 0.074 W/W | 0.186 W/W | 0.382 W/W | 0.048 W/W | 0.168 W/W |

In Examples 5 to 12, the photoelectric conversion unit 22 of each of the light conversion devices 2 is either a InGaAs PIN PD or a InGaAs APD, and a 1312 nm infrared laser light is used as the external light L1 to cause the light-emitting units 21 made of group III-V compound semiconductor to emit the modulated light L2 of 625 nm red light, 520 nm green light, 450 nm blue light or 370 nm ultraviolet light. Hence, the light conversion devices 2 of Examples 5 to 12 are acting as up-converters. It can be found from Table 2 that when the light conversion devices 2 each includes the light-emitting unit 21 made of group III-V compound semiconductor and the photoelectric conversion unit 22 including the PIN PD made of the group III-V compound semiconductor, i.e., Examples 5, 7, 9 and 11, the light conversion devices 2 has the conversion efficiency of between 0.026W/W and 0.186W/W. When the light conversion devices 2 each includes the light-emitting unit 21 made of group III-V compound semiconductor and the photoelectric conversion unit 22 including a APD made of group III-V compound semiconductor, i.e., Examples 6, 8, 10 and 12, the light conversion devices 2 had a conversion efficiency of between 0.074W/W and 0.382W/W.

In sum, for the light conversion unit 2 of this disclosure, the light emitting unit 21 and the photoelectric conversion unit 22 are first produced individually, then the regions of the light emitting unit 21 and the photoelectric conversion unit 22 having the same conductivity type are interconnected through the electroconductive bonding layer 23 by the flip-chip bonding technique so as to produce the light conversion device 2. The light conversion device 2 of the disclosure does not involve a complicated heterogeneous epitaxial structure, and high temperature and high pressure conditions used in wafer fusion bonding method are not required in this disclosure. Thus, the light conversion devices 2 used for up-converters or down-converters can be achieved by independently selecting the light-emitting units 21 that emit different wavelengths of light and combining with the external light L1 of different wavelengths.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light conversion device, comprising:
a light-emitting unit including a first-type region and a second-type region;
a photoelectric conversion unit including a first-type region and a second-type region, said photoelectric conversion unit being capable of converting an optical signal to an electrical signal when a reverse bias is applied thereto; and
an electroconductive bonding layer disposed between said light-emitting unit and said photoelectric conversion unit for connecting said second-type region of said light-emitting unit with said second-type region of said photoelectric conversion unit,
wherein said light conversion device is operated to receive a bias and an external light to make said light-emitting unit be under a forward bias and said photoelectric conversion unit be under the reverse bias, and the external light irradiates the photoelectric conversion unit such that said light-emitting unit generates a modulated light which has a frequency different from that of the external light,
wherein said second-type region of said light-emitting unit includes a first section and a second section different from said first section, said first-type region of said light-emitting unit is disposed on said first section of said second-type region of said light-emitting unit, and said second-type region of said photoelectric conversion unit is disposed on said second section of said second-type region of said light-emitting unit, and
wherein said photoelectric conversion unit further includes a first metal electrode and a second metal electrode respectively disposed at two opposite outer surfaces of said photoelectric conversion unit, and said light-emitting unit further includes a third metal electrode and a fourth metal electrode disposed on a same side of a substrate of said light-emitting unit.

2. The light conversion device as claim in claim 1, wherein each of said first-type region of said light-emitting unit and said first-type region of said photoelectric conversion unit comprises one of a p-type semiconductor layer and an n-type semiconductor layer, and each of said second-type region of said light-emitting unit and said second-type region of said photoelectric conversion unit comprises the other one of the p-type semiconductor layer and the n-type semiconductor layer.

3. The light conversion device as claimed in claim 1, wherein the frequency of the modulated light is higher than that of the external light.

4. The light conversion device as claimed in claim 1, wherein the frequency of the modulated light is lower than that of the external light.

5. The light conversion device as claimed in claim 1, wherein said electroconductive bonding layer is made of a metal material selected from the group consisting of indium (In), gold (Au), tin (Sn), gold indium (AuIn) alloy, gold tin (AuSn) alloy, indium tin (InSn) alloy, gold indium tin (AuInSn) alloy, tin lead (SnPb) alloy, gold germanium (AuGe) alloy, and gold silicon (AuSi) alloy.

6. The light conversion device as claimed in claim 1, wherein a projected area of said second-type region of said photoelectric conversion unit onto said light-emitting unit is smaller than a surface area of said second-type region of said light-emitting unit.

7. The light conversion device as claimed in claim 1, wherein said light-emitting unit includes one of a light-emitting diode (LED) which is made of III-V compound semiconductors and a laser diode which is made of III-V compound semiconductors, and said photoelectric conversion unit includes an avalanche photodiode (APD).

8. The light conversion device as claimed in claim 1, wherein said light-emitting unit includes one of an LED made of group III-V compound semiconductors and a laser diode made of group III-V compound semiconductors, and said photoelectric conversion unit includes one of an APD made of group III-V compound semiconductors and a positive-intrinsic-negative (PIN) photodiode made of group III-V compound semiconductors.

9. The light conversion device as claimed in claim 1, wherein:
said light-emitting unit is mesa-type; and
said photoelectric conversion unit is planar-type.

10. The light conversion device as claimed in claim 1, wherein said electroconductive bonding layer is disposed between said third metal electrode of said light-emitting unit and said first metal electrode of said photoelectric conversion unit.

* * * * *